US010725520B2

(12) United States Patent
Hansen et al.

(10) Patent No.: US 10,725,520 B2
(45) Date of Patent: Jul. 28, 2020

(54) DETERMINING A POWER CAPPING SIGNAL USING DIRECT MEMORY ACCESS

(71) Applicant: HEWLETT PACKARD ENTERPRISE DEVELOPMENT LP, Houston, TX (US)

(72) Inventors: Peter Hansen, Houston, TX (US); Julie Victoria Tan, Houston, TX (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 128 days.

(21) Appl. No.: 15/631,734

(22) Filed: Jun. 23, 2017

(65) Prior Publication Data
US 2018/0373303 A1 Dec. 27, 2018

(51) Int. Cl.
*G06F 1/3206* (2019.01)
*G06F 1/3225* (2019.01)
*H03M 1/50* (2006.01)
*H03K 7/08* (2006.01)
*H03M 1/00* (2006.01)

(52) U.S. Cl.
CPC .......... *G06F 1/3206* (2013.01); *G06F 1/3225* (2013.01); *H03K 7/08* (2013.01); *H03M 1/001* (2013.01); *H03M 1/002* (2013.01); *H03M 1/504* (2013.01)

(58) Field of Classification Search
None
See application file for complete search history.

(56) References Cited

U.S. PATENT DOCUMENTS

| 6,396,688 | B1 * | 5/2002 | Davies | G06F 1/20 361/51 |
| 7,501,872 | B2 | 3/2009 | Sun | |
| 8,495,545 | B2 * | 7/2013 | Needham | H03K 19/17776 716/101 |
| 8,612,789 | B2 | 12/2013 | Taylor | |

(Continued)

FOREIGN PATENT DOCUMENTS

IN 00011DE2009 1/2011

OTHER PUBLICATIONS

Altera Corporation, "Using Zero-Power CPLDs to Substantially Lower Power Consumption in Portable Applications," White Paper, Jul. 2009, Version 1.2, 7 pages, https://www.altera.com/content/dam/altera-www/global/en_US/pdfs/literature/wp/wp-01042-using-zero-power-cplds-to-lower-power-in-portable.pdf.

*Primary Examiner* — Paul Yen
(74) *Attorney, Agent, or Firm* — Hewlett Packard Enterprise Patent Department

(57) ABSTRACT

Examples disclosed herein relate to determination of a power capping signal based on direct memory access. In an example, a hardware timer in a processor may generate a hardware trigger. In response to the hardware trigger, an analog-to-digital convertor (ADC) engine may obtain an analog voltage signal from a server. ADC engine may convert the analog voltage signal to a digital output. ADC engine may then generate a second hardware trigger. In response to the second hardware trigger, a direct memory access engine may provide the digital output to a programmable logic device via a direct memory access (DMA) operation. The programmable logic device may determine a power capping signal based on the digital output, and provide the power capping signal to the server.

19 Claims, 4 Drawing Sheets

(56) References Cited

U.S. PATENT DOCUMENTS

| | | | |
|---|---|---|---|
| 9,383,807 B2 | 7/2016 | Jouin | |
| 2004/0012829 A1* | 1/2004 | Takahashi | H04N 1/0402 358/474 |
| 2007/0143635 A1* | 6/2007 | Hughes | G06F 1/3203 713/300 |
| 2010/0205414 A1* | 8/2010 | Miller | G06F 11/28 712/227 |
| 2010/0289949 A1* | 11/2010 | Kobayashi | G06F 13/4081 348/469 |
| 2011/0093733 A1* | 4/2011 | Kruglick | G06F 1/3203 713/340 |
| 2012/0331187 A1* | 12/2012 | Xu | G06F 13/28 710/25 |
| 2016/0299560 A1* | 10/2016 | Kondo | G06F 1/3212 |

\* cited by examiner

DETERMINING A POWER CAPPING SIGNAL USING DIRECT MEMORY ACCESS

BACKGROUND

The demand for Information Technology (IT) services (for example, cloud-based services) has grown manifold over the last couple of decades. The increased demand has led to the deployment of a large number of servers for providing those services. For example, a data center may include servers on the order of tens of thousands. Each server may consume a certain amount of power in order to function.

BRIEF DESCRIPTION OF THE DRAWINGS

For a better understanding of the solution, embodiments will now be described, purely by way of example, with reference to the accompanying drawings, in which.

DETAILED DESCRIPTION

A large number of servers are being deployed to provide various types of IT services. These deployments may range from a few servers (for example, in a small enterprise) to thousands of servers (for example, in a large data center). Since servers consume power in order to function, managing their power consumption is a desirable aspect. In this regard, a server power capping solution may enable setting up a power limit for a server. Coupled with better power monitoring and reporting of power consumption under load, server power capping may enable IT managers to more precisely utilize existing power and cooling resources. These mechanisms may allow an administrator to limit, or cap, the power consumption of a server or group of servers.

Some approaches to capping power consumption include firmware-based sampling of analog signals from a server on a periodic basis, and firmware-based determination of a pulse-width modulation (PMW) output based on the analog input. These approaches do not address spikes in power consumption that may occur between analog sampling times. This may reduce the measurement accuracy of a closed loop analog measuring poll cycle. Further, the polling times may be limited to due to limitations in firmware execution speed.

To address these technical challenges, the present disclosure describes various examples for determining a power capping signal based on direct memory access. In an example, a hardware timer in a processor may generate a hardware trigger. In response to the hardware trigger, an analog-to-digital convertor (ADC) engine may obtain an analog voltage signal from a server. ADC engine 104 may convert the analog voltage signal to a digital output. ADC engine 104 may then generate a second hardware trigger. In response to the second hardware trigger, a direct memory access engine may provide the digital output to a programmable logic device via a direct memory access (DMA) operation. The programmable logic device may determine a power capping signal based on the digital output. The power capping signal may be provided to the server to regulate its power consumption. The current disclosure describes examples that allow an increase in analog measuring frequency by using hardware-based controls. The examples described herein increases the measurement accuracy of a closed loop analog measuring poll cycle.

Figure 1:
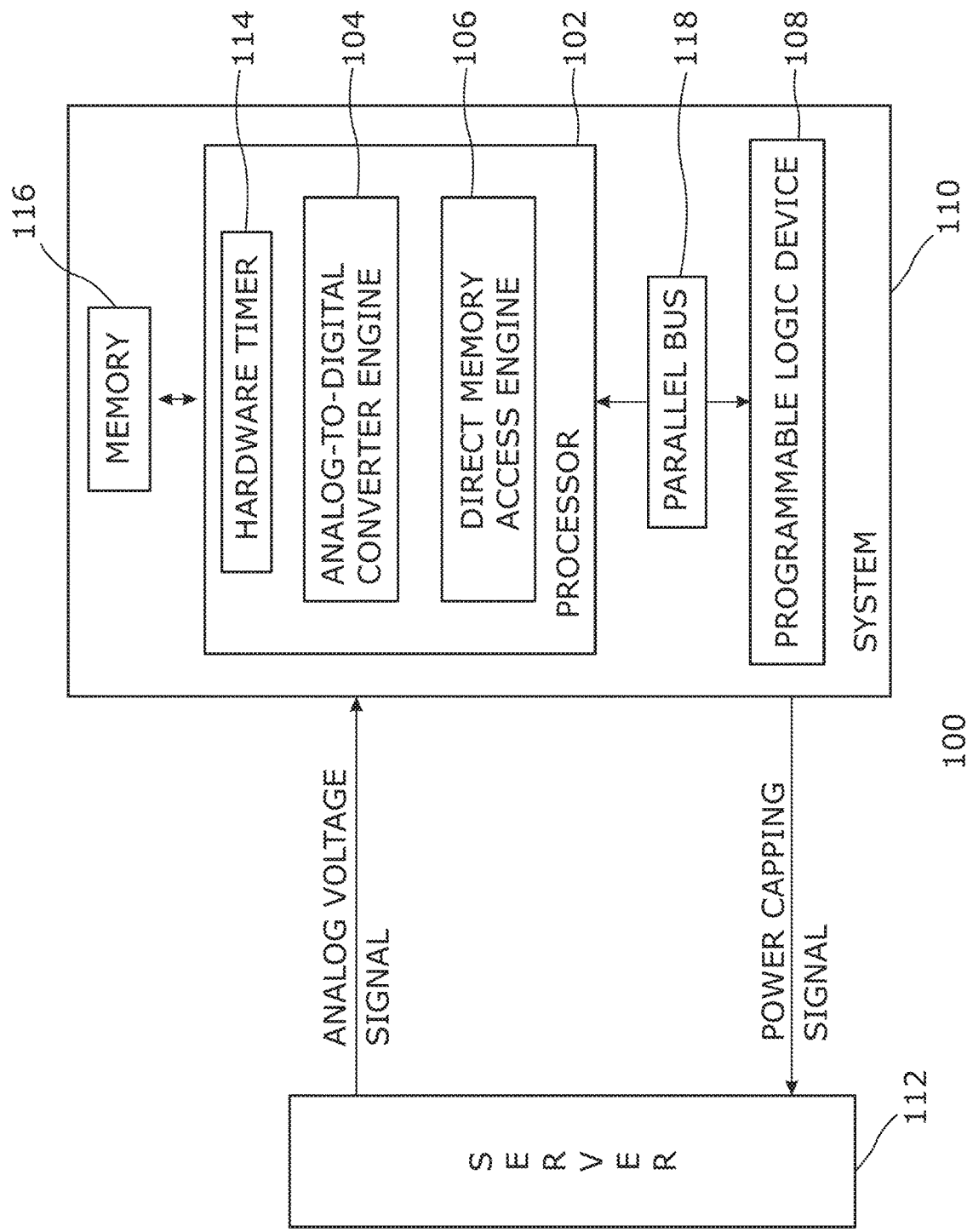
FIG. 1 is a block diagram of an example computing environment for determining a power capping signal using direct memory access (DMA)

FIG. 1 is a block diagram of an example computing environment 100 for determining a power capping signal based on direct memory access. In an example, the computing environment may include a system 110 and a server 112. Although one server is shown in FIG. 1, other examples of this disclosure may include more than one server. In an example, system 110 may be a power capping system. In an example, system 110 may be communicatively coupled to server 112, for example, via a wired or wireless medium. In an example, server 112 may include a blade server. In an example, server 112 may include a rack server.

As used herein, the term "server" may include a computer and/or a computer program (machine-readable instructions) that may process requests from other (client) computers over a network.

In an example, system 110 may include a processor 102, an analog-to-digital convertor (ADC) engine 104, a direct memory access engine 106, and a programmable logic device 108.

Processor 102 may be any type of Central Processing Unit (CPU) or processing logic that interprets and executes machine-readable instructions. In an example, processor 102 may include a microcontroller, a microprocessor, a programmable gate array, an application specific integrated circuit (ASIC), a computer processor, or the like. Processor 102 may, for example, include multiple cores on a chip, multiple cores across multiple chips, multiple cores across multiple devices, or combinations thereof. In some examples, processor 102 may include an integrated circuit (IC), other control logic, other electronic circuits, or combinations thereof. In an example, processor 102 may be coupled to a memory 116.

Analog-to-digital converter (ADC) engine 104 may convert an analog signal into a digital signal. ADC 104 may convert an input analog voltage or current to a digital output or number proportional to the magnitude of the input voltage or current. In an example, ADC 104 may be integrated with processor 102. In an example, ADC 104 may be separate from processor 102. In an example, ADC may receive an analog voltage signal from a server. The analog voltage signal may be proportional to the current consumed by the server.

Direct memory access (DMA) engine 106 may be used to perform a direct memory access operation. A direct memory access operation may allow an input/output (I/O) device to send or receive data directly to or from the main memory of system 110, bypassing processor 102 to speed up memory operations. In an example, DMA engine 106 may be integrated with processor 102. In an example, DMA engine 106 may be separate from processor 102.

Engines 104 and 106 may include any combination of hardware and programming to implement the functionalities of the engines described herein, but at least include hardware that is configured to perform the functionalities. In examples described herein, such combinations of hardware and software may be implemented in a number of different ways.

For example, the programming for the engines may be processor executable instructions stored on at least one non-transitory machine-readable storage medium and the hardware for the engines may include at least one processing resource to execute those instructions. In some examples, the hardware may also include other electronic circuitry to at least partially implement at least one engine of system 110. In some examples, the at least one machine-readable storage medium may store instructions that, when executed by the at least one processing resource, at least partially implement some or all engines of system 110. In such examples, system 110 may include the at least one machine-readable storage medium storing the instructions and the at least one processing resource to execute the instructions.

Programmable logic device (PLD) 108 may include an electronic component used to build reconfigurable digital circuits. A programmable logic device may not have a defined function once manufactured, and may have to be programmed before it can be used. In an example, programmable logic device 108 may include a complex programmable logic device (CPLD). In an example, PLD may be communicatively coupled to processor via, for example, a parallel bus 118. In an example, the parallel bus may include an 8-bit memory addressed parallel bus.

In an example, a hardware timer 114 in processor 102 may generate a hardware trigger. A hardware trigger may include a notification or indication that a hardware event has occurred. Hardware event may include an internal event (for example, a periodic timer). In an example, hardware timer 114 may include a configurable clock input. On each clock pulse, hardware timer may either increment or decrement a counter. When the counter reaches some defined value, hardware timer 114 may generate a trigger. In response to the hardware trigger, ADC engine 104 may obtain or receive an analog voltage signal from a server (for example, 112). The analog voltage signal may be proportional to the current consumed by the server. In an example, the analog voltage signal may be measured by a current or load sensor on the server. In some examples, ADC engine may obtain or receive samples of analog voltage signals from the server. ADC engine 104 may calculate an average value from the samples. In some examples, ADC engine 104 may include a plurality of analog signal channels (or ADC channels) for receiving a plurality of analog measurement signals, for example, from a plurality of servers. In an example, the plurality of servers may include blade servers in a blade system. The blade system may be arranged in a rack. In another example, the plurality of servers may include rack servers, which may be arranged in a rack. Each analog measurement signal may represent current power consumption of a particular server. In some examples, ADC engine 104 may be coupled to several channels via an external multiplexer. The multiplexer may be controlled by processor 102 via general-purpose input/output (GPIO) pins. The multiplexer may connect the input of ADC engine 104 to any of the channels.

ADC engine 104 may convert the analog voltage signal from the server to a digital output (for example, a digital value). Once the conversion is complete, ADC engine 104 may generate a second hardware trigger. In response to the second hardware trigger, DMA engine 106 may provide the digital output from ADC engine 104 to programmable logic device 108 via a direct memory access (DMA) operation. In an example, providing the digital output to the programmable logic device 108 may comprise providing the digital output to a memory mapped register(s) of the programmable logic device 108, which may be coupled to processor 102 via a parallel bus. In another example, providing the digital output to the programmable logic device 108 may comprise writing the digital output to a memory mapped parallel bus address space of processor 102, and to a register(s) in the programmable logic device 108.

Programmable logic device 108 may identify the digital output from the register(s) that stores the digital output. Programmable logic device 108 may determine a power capping signal based on the digital output. In an example, programmable logic device 108 may provide the power capping signal to the server to regulate the power consumption of the server. In an example, determining the power capping signal may involve determining a pulse-width modulation (PWM) output signal based on the digital output generated by ADC engine 104 for the server.

The behavior of the PWM output signal may be defined in terms of a duty cycle and a PWM rate. The duty cycle describes the amount of time the signal is in a high (on) state as a percentage of the total time of it takes to complete one cycle. The PWM rate may determine how fast the PWM completes a cycle, and therefore how fast it switches between high and low states. The longer the switch is on compared to the off periods, the higher the total power supplied to the load. The PWM rate may be used to regulate the power consumption of the server. The PWM output signal may be sent to the processor of the server and used for moderating the processor thermal protection pin to throttle the processor power usage accordingly.

In an example, once DMA operation related to transfer of the digital output to programmable logic device 108 is complete, ADC engine 104 may generate a third hardware trigger. The third hardware trigger may trigger a second direct memory access operation by DMA engine 106. The second direct memory access operation may provide configuration information for measuring analog voltage signals on a second ADC channel. In an example, the second ADC channel may include another ADC channel (for example, next ADC channel) on processor 102. In an example, the second ADC channel may include a different analog voltage signal, for example, from a second server, to an external multiplexer controller by processor 102. In an example, the configuration information may include a register write (via the second DMA) that may alter the state of a set of GPO pins to an analog mux that may change the analog channel that is being measured. In another example, the configuration information may include a register write that changes the analog-to-digital channel of processor 102 to a different pin or analog-to-digital converter.

Figure 2:
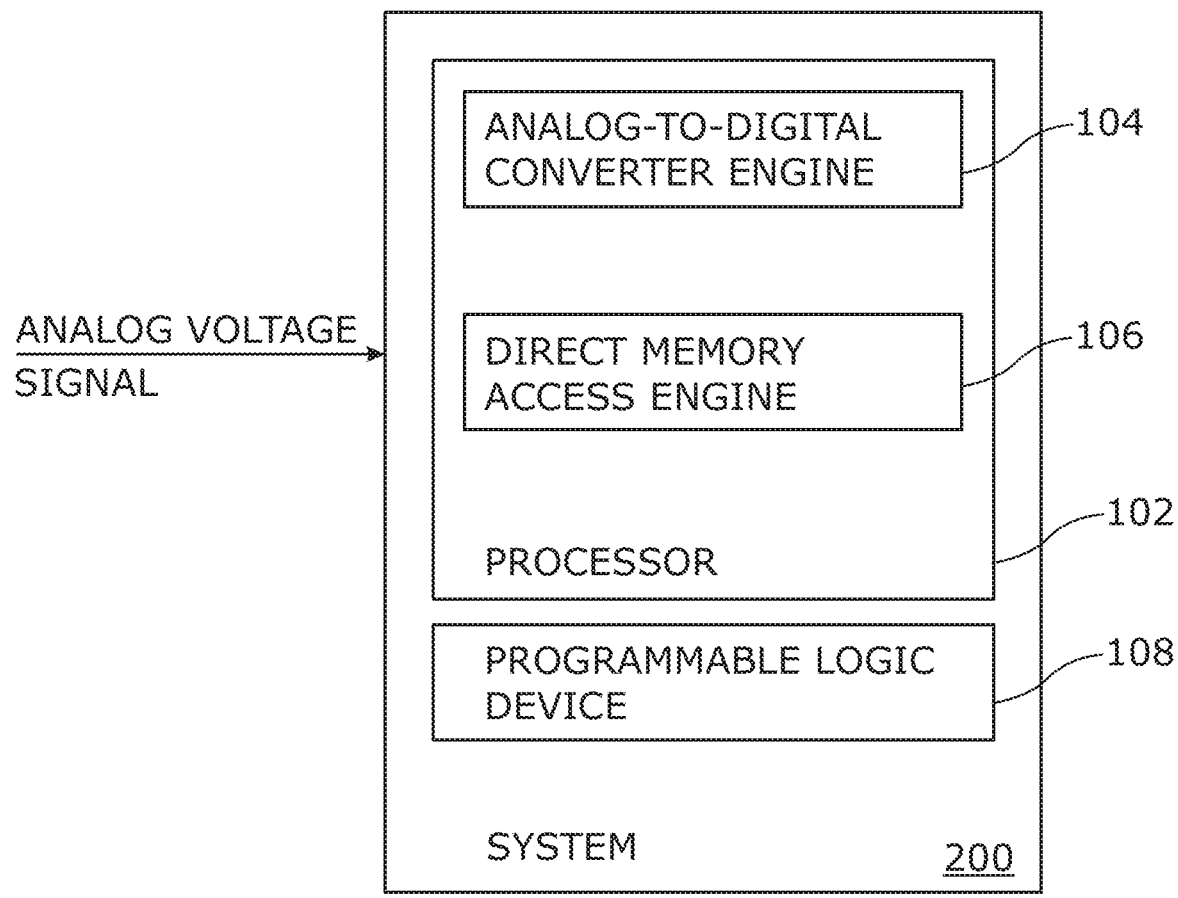
FIG. 2 is a block diagram of an example system for determining a power capping signal using direct memory access (DMA)

FIG. 2 is a block diagram of an example system 200 for determining a power capping signal based on direct memory access. In an example, system 200 may be analogous to system 110 of FIG. 1, in which like reference numerals correspond to the same or similar, though perhaps not identical, components. For the sake of brevity, components or reference numerals of FIG. 2 having a same or similarly described function in FIG. 1 are not being described in detail in connection with FIG. 2. Said components or reference numerals may be considered alike.

In an example, system 200 may include a processor 102, an analog-to-digital convertor (ADC) engine 104, a direct memory access engine 106, and a programmable logic device 108.

In an example, a hardware timer in processor 102 may generate a hardware trigger. In response to the hardware trigger, ADC engine 104 may receive an analog voltage signal from a server. ADC engine 104 may convert the analog voltage signal to a digital output. Subsequent to the conversion, ADC engine 104 may generate a second hardware trigger. In response to the second hardware trigger, a direct memory access (DMA) engine 106 may provide the digital output to programmable logic device 108 via a direct memory access (DMA) operation. Programmable logic device 108 may determine a power capping signal based on the digital output, and provide the power capping signal to the server. DMA engine 106 may then reset the hardware timer.

Figure 3:
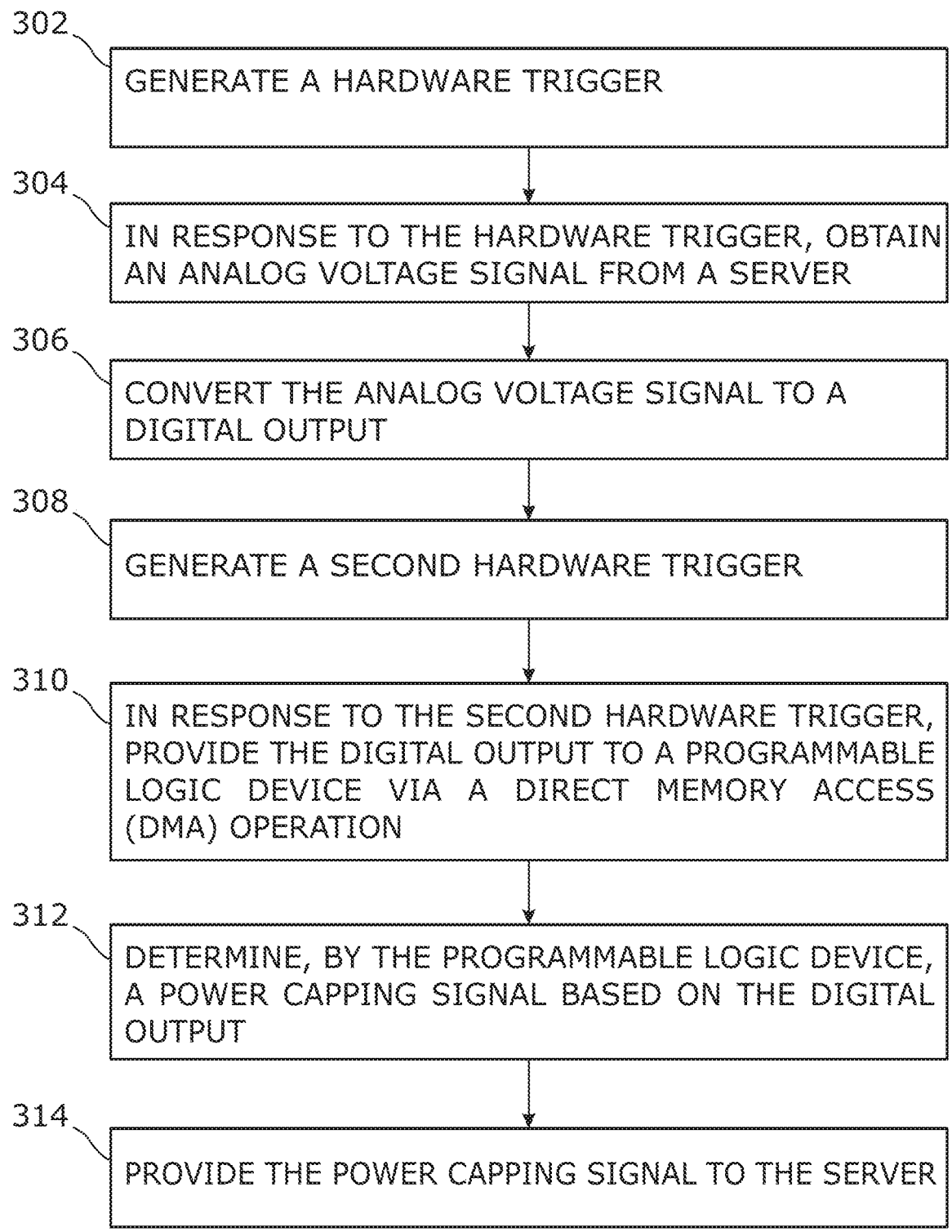
FIG. 3 is a block diagram of an example method of determining a power capping signal using direct memory access (DMA)

FIG. 3 is a block diagram of an example method 300 of determining a power capping signal based on direct memory access. The method 300, which is described below, may be partially executed on a system such as system 110 of FIG. 1 or system 200 of FIG. 2. However, other suitable computing devices may execute method 300 as well. At block 302, a processor may generate a hardware trigger. At block 304, an analog-to-digital convertor (ADC) engine (for example, 104) may obtain an analog voltage signal from a server. At block 306, ADC engine 104 may convert the analog voltage signal to a digital output. At block 308, ADC engine 104 may generate a second hardware trigger. At block 310, in response to the second hardware trigger, a direct memory access engine (for example, 106) may provide the digital output to a programmable logic device (for example, 108) via a direct memory access (DMA) operation. At block 312, programmable logic device 108 may determine a power capping signal based on the digital output. At block 314, programmable logic device 108 may provide the power capping signal to the server.

Figure 4:
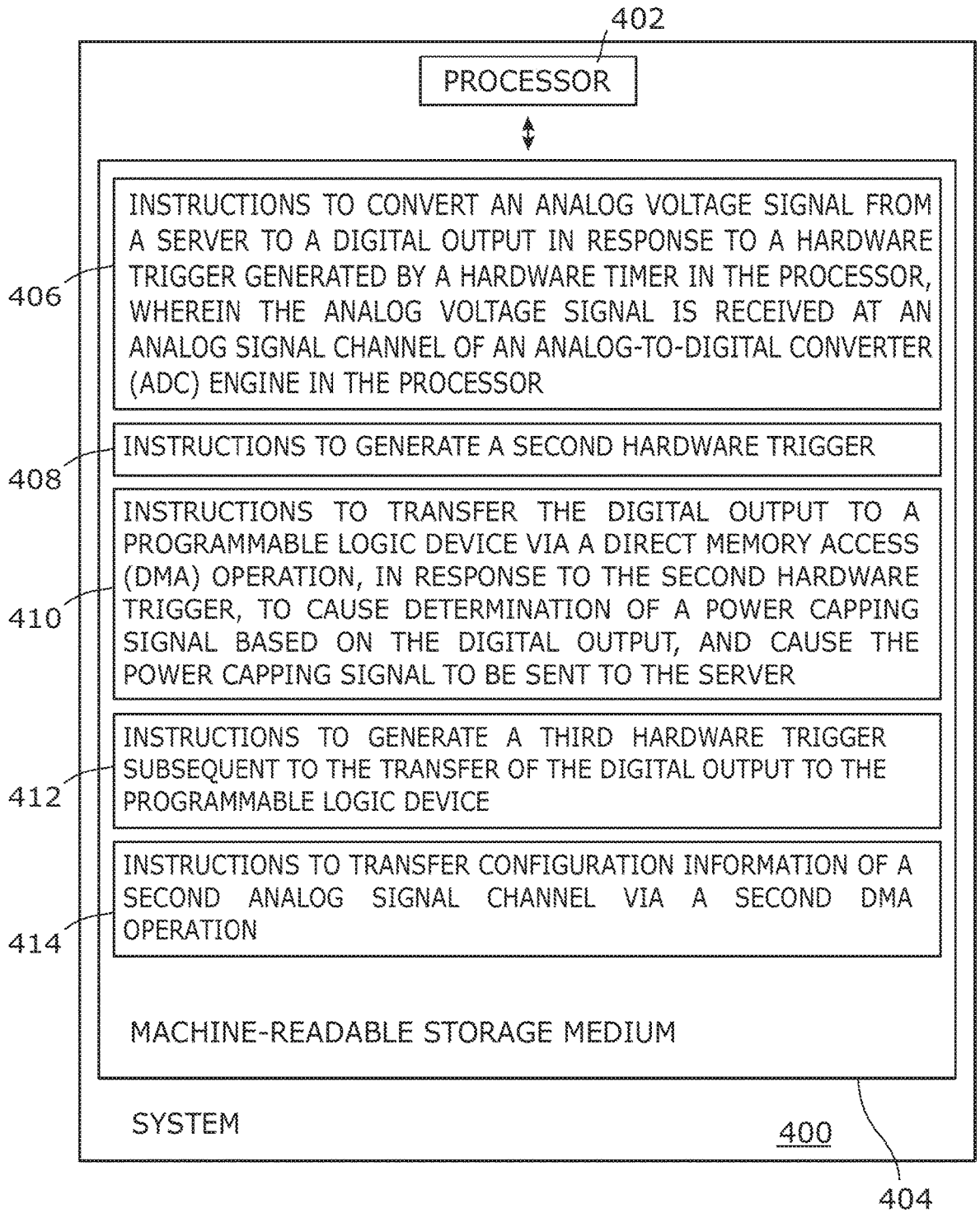
FIG. 4 is a block diagram of an example system including instructions in a machine-readable storage medium for determining a power capping signal using direct memory access (DMA).

FIG. 4 is a block diagram of an example system 400 including instructions in a machine-readable storage medium for determining a power capping signal based on direct memory access. System 400 includes a processor 402 and a machine-readable storage medium 404 communicatively coupled through a system bus. In an example, system 400 may be analogous to computing system 110 of FIG. 1, or system 200 of FIG. 2. Processor 402 may be any type of Central Processing Unit (CPU), microprocessor, or processing logic that interprets and executes machine-readable instructions stored in machine-readable storage medium 404. Machine-readable storage medium 404 may be a random access memory (RAM) or another type of dynamic storage device that may store information and machine-readable instructions that may be executed by processor 402. For example, machine-readable storage medium 404 may be Synchronous DRAM (SDRAM), Double Data Rate (DDR), Rambus DRAM (RDRAM), Rambus RAM, etc. or storage memory media such as a floppy disk, a hard disk, a CD-ROM, a DVD, a pen drive, and the like. In an example, machine-readable storage medium may be a non-transitory machine-readable medium.

Machine-readable storage medium 404 may store instructions 406, 408, 410, 412, and 414. In an example, instructions 406 may be executed by processor 402 to convert, in response to a hardware trigger generated by a hardware timer in the processor, an analog voltage signal from a server to a digital output. The analog voltage signal may be received at an analog signal channel of an analog-to-digital convertor (ADC) engine in the processor. Instructions 408 may be executed by processor 402 to generate a second hardware trigger. Instructions 410 may be executed by processor 402 to transfer, in response to the second hardware trigger, the digital output to a programmable logic device via a direct memory access (DMA) operation, to cause determination of a power capping signal based on the digital output, and cause the power capping signal to be sent to the server. Instructions 412 may be executed by processor 402 to generate a third hardware trigger subsequent to the transfer of the digital output to the programmable logic device. Instructions 414 may be executed by processor 402 to transfer configuration information of a second analog signal channel via a second DMA operation.

For the purpose of simplicity of explanation, the example method of FIG. 3 is shown as executing serially, however it is to be understood and appreciated that the present and other examples are not limited by the illustrated order. The example systems of FIGS. 1, 2, and 4, and method of FIG. 3 may be implemented in the form of a computer program product including computer-executable instructions, such as program code, which may be run on any suitable computing device. Examples within the scope of the present solution may also include program products comprising non-transitory computer-readable media for carrying or having computer-executable instructions or data structures stored thereon. Such computer-readable media can be any available media that can be accessed by a general purpose or special purpose computer. By way of example, such computer-readable media can comprise RAM, ROM, EPROM, EEPROM, CD-ROM, magnetic disk storage or other storage devices, or any other medium which can be used to carry or store desired program code in the form of computer-executable instructions and which can be accessed by a general purpose or special purpose computer. The computer readable instructions can also be accessed from memory and executed by a processor.

It should be noted that the above-described examples of the present solution is for the purpose of illustration only. Although the solution has been described in conjunction with a specific example thereof, numerous modifications may be possible without materially departing from the teachings and advantages of the subject matter described herein. Other substitutions, modifications and changes may be made without departing from the spirit of the present solution. All of the features disclosed in this specification (including any accompanying claims, abstract and drawings), and/or all of the steps of any method or process so disclosed, may be combined in any combination, except combinations where at least some of such features and/or steps are mutually exclusive.

The invention claimed is:
1. A method comprising:
generating a first hardware trigger by a processor;
in response to the first hardware trigger, obtaining a first analog voltage signal from a first server;
converting, by an analog-to-digital converter (ADC), the first analog voltage signal to a digital output, the first analog voltage signal received at a first ADC channel of a plurality of ADC channels of the ADC;
generating, by the ADC, a second hardware trigger in response to completion of the converting of the first analog voltage signal to the digital output;
in response to the second hardware trigger, providing, by a direct memory access (DMA) engine, the digital output to a programmable logic device in a first DMA operation;
determining, by the programmable logic device, a power capping signal based on the digital output;
providing the power capping signal to the first server;
generating a third hardware trigger subsequent to providing the digital output to the programmable logic device;
in response to the third hardware trigger, providing, by the DMA engine in a second DMA operation, configuration information that selects a second ADC channel of the plurality of ADC channels, the second ADC channel to receive a second analog voltage signal from a second server;

converting, by the ADC, the second analog voltage signal to a second digital output;

generating, by the ADC, a further hardware trigger in response to completion of the converting of the second analog voltage signal to the second digital output;

in response to the further hardware trigger, providing, by the DMA engine, the second digital output to the programmable logic device in a further DMA operation;

determining, by the programmable logic device, a second power capping signal based on the second digital output; and providing the second power capping signal to the second server.

2. The method of claim 1, wherein the determining of the power capping signal comprises:

determining a pulse-width modulation (PWM) output based on the digital output; and defining a PWM rate for the first server based on the PWM output.

3. The method of claim 1, wherein the digital output is provided in the first DMA operation to a memory mapped register of the programmable logic device.

4. The method of claim 1, wherein the obtaining of the first analog voltage signal comprises obtaining samples of the first analog voltage signal from the first server.

5. The method of claim 1, wherein the providing of the configuration information alters a state of a multiplexer to select a different ADC channel of the plurality of ADC channels for measurement.

6. The method of claim 4, comprising computing an average of the samples of the first analog voltage signal, and wherein the digital output is based on the average of the samples of the first analog voltage signal.

7. A system comprising:

a programmable logic device;

an analog-to-digital converter (ADC) to:

in response to a first hardware trigger, receive, at a first ADC channel of a plurality of ADC channels of the ADC, a first analog voltage signal from a first server, convert the first analog voltage signal to a digital output, and generate a second hardware trigger in response to completion of the converting of the first analog voltage signal to the digital output;

a processor to, in response to the second hardware trigger, provide the digital output to the programmable logic device in a first direct memory access (DMA) operation, the programmable logic device to:

determine a power capping signal based on the digital output, and provide the power capping signal to the first server, wherein the ADC is to generate a third hardware trigger responsive to completion of the first DMA operation, wherein the processor is to, in response to the third hardware trigger, provide, in a second DMA operation, configuration information that selects a second ADC channel of the plurality of ADC channels, the second ADC channel to receive a second analog voltage signal from a second server, wherein the ADC is to:

convert the second analog voltage signal to a second digital output, and generate a further hardware trigger in response to completion of the converting of the second analog voltage signal to the second digital output, wherein the processor is to, in response to the further hardware trigger, provide the second digital output to the programmable logic device in a further DMA operation, wherein the programmable logic device is to:

determine a second power capping signal based on the second digital output, and provide the second power capping signal to the second server.

8. The system of claim 7, wherein the programmable logic device is coupled to the processor via a bus.

9. The system of claim 7, wherein the power capping signal is to regulate power consumption of the first server.

10. The system of claim 7, wherein the processor includes a microcontroller.

11. The system of claim 7, wherein the processor is to provide the digital output to the programmable logic device via a parallel bus.

12. The system of claim 7, wherein the programmable logic device comprises a complex programmable logic device (CPLD).

13. The system of claim 7, wherein the first server comprises a blade server.

14. The system of claim 7, wherein the processor is to provide the digital output in the first DMA operation to a memory mapped register of the programmable logic device.

15. The system of claim 14, wherein the processor is to provide the configuration information in the second DMA operation using a register write.

16. A system comprising:

a programmable logic device;

an analog-to-digital converter (ADC) to:

convert a first analog voltage signal received at a first ADC channel of a plurality of ADC channels of the ADC from a first server to a digital output, in response to a first hardware trigger generated by a hardware timer in a processor, and generate a second hardware trigger in response to completion of the converting of the first analog voltage signal to the digital output;

a direct memory access (DMA) engine to, in response to the second hardware trigger, transfer the digital output to the programmable logic device in a first DMA operation, the programmable logic device to determine a power capping signal based on the digital output, and send the power capping signal to the first server, wherein the ADC is to generate a third hardware trigger subsequent to the transfer of the digital output to the programmable logic device, wherein the DMA engine is to, in response to the third hardware trigger, provide, in a second DMA operation, configuration information that selects a second ADC channel of the plurality of ADC channels, the second ADC channel to receive a second analog voltage signal from a second server, wherein the ADC is to:

convert the second analog voltage signal to a second digital output, and generate a further hardware trigger in response to completion of the converting of the second analog voltage signal to the second digital output, wherein the DMA engine is to, in response to the further hardware trigger, provide the second digital output to the programmable logic device in a further DMA operation, wherein the programmable logic device is to:
determine a second power capping signal based on the second digital output, and
provide the second power capping signal to the second server.

17. The system of claim 16, wherein the DMA engine is to perform a DMA write in the second DMA operation to alter a state of a multiplexer to select the second ADC channel for measurement.

18. The system of claim 16, wherein the DMA engine is to reset the hardware timer subsequent to transfer of the configuration information.

19. The system of claim 16, wherein the DMA engine is to write the digital output to a register in the programmable logic device.

* * * * *